U S008822808B2

(12) United States Patent
Hamano (10) Patent No.: US 8,822,808 B2
(45) Date of Patent: Sep. 2, 2014

(54) PHOTOELECTRIC CONVERSION DEVICE, METHOD FOR MANUFACTURING THE SAME, PHOTO SENSOR AND IMAGING DEVICE

(75) Inventor: Mitsumasa Hamano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/638,000

(22) PCT Filed: Mar. 24, 2011

(86) PCT No.: PCT/JP2011/057251
§ 371 (c)(1),
(2), (4) Date: Sep. 28, 2012

(87) PCT Pub. No.: WO2011/125527
PCT Pub. Date: Oct. 13, 2011

(65) Prior Publication Data
US 2013/0015547 A1 Jan. 17, 2013

(30) Foreign Application Priority Data
Mar. 31, 2010 (JP) .................................. 2010-084406
Dec. 27, 2010 (JP) .................................. 2010-291376

(51) Int. Cl.
*H01L 25/00* (2006.01)
(52) U.S. Cl.
USPC ................. 136/243; 257/40; 528/37
(58) Field of Classification Search
USPC ................. 257/40; 136/243; 528/37
See application file for complete search history.

(56) References Cited
U.S. PATENT DOCUMENTS
2005/0257827 A1 11/2005 Gaudiana et al.
2005/0268962 A1 12/2005 Gaudiana et al.
(Continued)

FOREIGN PATENT DOCUMENTS
JP        05335614 A    12/1993
JP     2004-165474 A     6/2004
(Continued)

OTHER PUBLICATIONS
Written Opinion for PCT/JP2011/057251, dated Jun. 14, 2011 [PCT/ISA/237].
(Continued)

*Primary Examiner* — David Vu
*Assistant Examiner* — Brandon Fox
(74) *Attorney, Agent, or Firm* — Sughrue Mion, PLLC (57) ABSTRACT

Provided are a photoelectric conversion device capable of controlling an absorbance of the red region at a wavelength of 600 nm or more, and an imaging device having an improved color reproduction by using the photoelectric device. Provided are a photoelectric conversion device that includes a pair of electrodes, and a photoelectric conversion layer disposed between the pair of electrodes, in which the photoelectric conversion layer contains a p-type semiconductor compound and two or more different kinds of unsubstituted fullerenes, and an imaging device that includes the photoelectric conversion device.

39 Claims, 2 Drawing Sheets

(56) References Cited

U.S. PATENT DOCUMENTS

| | | |
|---|---|---|
| 2006/0005876 A1 | 1/2006 | Gaudiana et al. |
| 2006/0076048 A1 | 4/2006 | Gaudiana et al. |
| 2007/0012349 A1 | 1/2007 | Gaudiana et al. |
| 2007/0062577 A1 | 3/2007 | Koppe |
| 2007/0115399 A1 | 5/2007 | Brabec et al. |
| 2009/0223566 A1* | 9/2009 | Mitsui et al. ............ 136/263 |
| 2010/0127244 A1* | 5/2010 | Kronholm et al. ........ 257/40 |
| 2010/0317767 A1 | 12/2010 | Tanaka et al. |

FOREIGN PATENT DOCUMENTS

| | | |
|---|---|---|
| JP | 2007-123707 A | 5/2007 |
| JP | 2007-335760 A | 12/2007 |
| JP | 2008-537846 A | 9/2008 |
| JP | 2009-506360 A | 2/2009 |
| JP | 2009-105336 A | 5/2009 |
| JP | 2009196965 A | 9/2009 |
| WO | 2007/011739 A2 | 1/2007 |
| WO | 2008/081845 A1 | 7/2008 |

OTHER PUBLICATIONS

International Search Report for PCT/JP2011/057251, dated Jun. 14, 2011 [PCT/ISA/237], previously submitted on Sep. 28, 2012.

Communication from the Japanese Patent Office dated Jun. 7, 2011, in counterpart application No. 2010-291376.

Communication from the Japanese Patent Office dated Nov. 15, 2011, in counterpart application No. 2010-291376.

Communication from the Japanese Patent Office dated Oct. 23, 2012, in counterpart application No. 2010-291376.

Office Action dated Feb. 19, 2013, issued by the Japanese Patent Office in counterpart Japanese Application No. 2010-291376.

* cited by examiner

FIG. 1

PHOTOELECTRIC CONVERSION DEVICE, METHOD FOR MANUFACTURING THE SAME, PHOTO SENSOR AND IMAGING DEVICE

TECHNICAL FIELD

The present invention relates to a photoelectric conversion device, a method for manufacturing the same, a photo sensor and an imaging device.

BACKGROUND ART

A photoelectric conversion device is a device that generates electric charges in a photoelectric conversion layer in accordance with light incident from the side of a transparent electrode having light transmittance of a pair of electrodes, and reads out the generated electric charge as a signal electric charge from the electrode. An imaging device) a photo sensor, a solar cell and the like have been known so far as a device using such a photoelectric conversion device.

For the purpose of improving photoelectric conversion efficiency, Patent Document 1 discloses an imaging device that includes a photoelectric conversion device in which a photoelectric conversion layer containing a p-type semiconductor and an n-type semiconductor is disposed between a pair of electrodes, and a fullerene or a fullerene derivative is contained in the photoelectric conversion layer. However, from the viewpoint of improving color reproduction, an absorbance of the red region (wavelength of 600 nm or more) is required to control the long wavelength end of absorption, but by the method disclosed in the Patent Document 1, it was difficult to manufacture a photoelectric conversion device which controls a long wavelength end.

In addition, Patent Documents 2 and 3 disclose a photoelectric cell in which two kinds of fullerenes are mixed in a photoelectric conversion layer, and further, in order to improve thermal stability, the photoelectric conversion layer is composed of a mixture of substituted and unsubstituted fullerenes. However, in Patent Documents 2 and 3, one of the two kinds of fullerenes is a fullerene having a substituent, and the use of two or more kinds of unsubstituted fullerenes is not disclosed. Further, unlike an imaging device, a photoelectric cell is not required to have an improved color reproduction. Also, in Patent Documents 2 and 3, there is virtually no description about the control of the long wavelength end of absorption in the infrared region, and no specific description or suggestion about the applicability to a photoelectric conversion layer for an imaging device.

RELATED ART

Patent Document

[Patent Document 1] Japanese Patent Application Laid-Open No. 2007-123707
[Patent Document 2] Japanese Patent Application Laid-Open No. 2008-537846
[Patent Document 3] Japanese Patent Application Laid-Open No. 2009-506360

DISCLOSURE OF INVENTION

Problems to be Solved by the Invention

The present invention has been made in consideration of the above circumstances to provide a photoelectric conversion device in which an absorbance of the red region having a wavelength of 600 nm or more can be controlled, and a method for manufacturing the photoelectric conversion device. Further, an object of the present invention is to provide a photo sensor using the photoelectric conversion device, and an imaging device having an improved color reproduction.

Means for Solving the Problems

The problems can be solved by the following means.
[1] A photoelectric conversion device comprising:
a pair of electrodes; and
a photoelectric conversion layer disposed between the pair of electrodes,
wherein the photoelectric conversion layer contains a p-type semiconductor compound and two or more different kinds of substituted fullerenes.
[2] The photoelectric conversion device as described in [1], wherein at least one of the two or more kinds of =substituted fullerenes is $C_n$ (wherein, n is an integer of 60 or more, geometrically forming a spherical compound).
[3] The photoelectric conversion device as described in [2], wherein one of the two or more kinds of unsubstituted fullerenes is $C_{60}$.
[4] The photoelectric conversion device as described in [3], wherein another of the two or more kinds of unsubstituted fullerenes is $C_{70}$.
[5] The photoelectric conversion device as described in any one of [1] to [4],
wherein there are two kinds of unsubstituted fullerenes.
[6] The photoelectric conversion device as described in [5],
wherein the two kinds of unsubstituted fullerenes are $C_{60}$ and $C_{70}$.
[7] The photoelectric conversion device as described in [4] or [6],
wherein a ratio of the content of $C_{70}$ in the photoelectric conversion layer is from 20% by volume to 99% by volume based on a sum of $C_{60}$ and $C_{70}$.
[8] The photoelectric conversion device as described in any one of [1] to [7],
wherein the p-type semiconductor compound has a peak wavelength of an absorption spectrum at 600 nm or less in chloroform solution, and the maximum molar extinction coefficient of 30,000 $M^{-1}$ $cm^{-1}$ or more in the visible region having a wavelength of 400 nm to 700 nm.
[9] The photoelectric conversion device as described, in any one of [1] to [8],
wherein when an absorbance at a wavelength of λ nm is A(λ), A(650)/A(680)>1.62.
[10] The photoelectric conversion device as described in any one of [1] to [9] above,
wherein when an absorbance at a wavelength of λ nm is A(λ), A(630)/A(680)>2.58.
[11] The photoelectric conversion device as described in any one of [1] to [10],
wherein a ratio of contents of the p-type semiconductor compound and the unsubstituted fullerene [(the content of the total of the two or more kinds of unsubstituted fullerene)/(the content of the p-type semiconductor compound)×100(%)], is 50% (by volume) or more.
[12] The photoelectric conversion device as described in any one of [1] to [11],
wherein the photoelectric conversion layer is formed by a dry film forming method.

[13] The photoelectric conversion device as described in [12], wherein the dry film forming method is a vacuum deposition method.

[14] A method for manufacturing the photoelectric conversion device of any one of [1] to [13], comprising:

a step of co-depositing the p-type semiconductor compound and the two or more different kinds of unsubstituted fullerenes by a vacuum thermal evaporation to form the photoelectric conversion layer.

[15] A photo sensor comprising the photoelectric conversion device according to any one of [1] to [13].

[16] An imaging device comprising the photoelectric, conversion device according to any one of [1] to [13].

Effects of the Invention

According to the present invention, a photoelectric conversion device is obtained, in which the long wavelength end of absorption is controlled by changing an absorbance of the red region. By using the photoelectric conversion device, it is possible to obtain an imaging device having an improved color reproduction.

EMBODIMENTS FOR CARRYING OUT THE INVENTION

Hereinafter, embodiments of the present invention will be described.

<Photoelectric Conversion Device>

The photoelectric conversion device according to the present invention includes a pair of electrodes and a photoelectric conversion layer disposed between the pair of electrodes, and the photoelectric conversion layer contains a p-type semiconductor compound and two or more different kinds of unsubstituted fullerenes.

As the photoelectric conversion layer contains two or more kinds of unsubstituted fullerenes, it is possible to change an absorbance of the red region of a wavelength of 600 nm or more (preferably from 600 nm to 750 nm), and thereby control the long wavelength end of absorption. As a result, an imaging device can obtain optimal spectral characteristics of the red region, and by using the photoelectric conversion device of the present invention, it is possible to improve color reproduction of the imaging device.

An absorbance of the red region in the photoelectric conversion layer can be controlled by changing a mixing ratio of two or more different kinds of unsubstituted fullerenes.

As for the absorbance of the red region, it is preferable to improve the absorbance at the wavelength of from 600 nm to 650 nm as much as possible, and to maintain the absorbance at the wavelength of 680 nm or more as low as possible. As a result, a correction to the red region by an infrared cut filter or a signal processing is not necessary, and by changing a mixing ratio of two or more different kinds of unsubstituted fullerenes, it is possible to minutely adjust the absorbance of the red region, thereby changing the long wavelength end of absorption in a desired manner.

As for the absorbance of the red region, when an absorbance at a wavelength of λ nm is A(λ), then preferably $A(650)/A(680)>1.62$, and more preferably $A(650)/A(680)>1.70$. Further, preferably $A(630)/A(680)>2.58$, and more preferably $A(630)/A(680)>2.71$. When an absorbance of the red region satisfies the relation, the long wavelength end of absorption is appropriately controlled to make it possible to obtain spectral characteristics suitable for an imaging device. For this reason, it is preferred in that color reproduction of the imaging device is improved.

Figure 1:
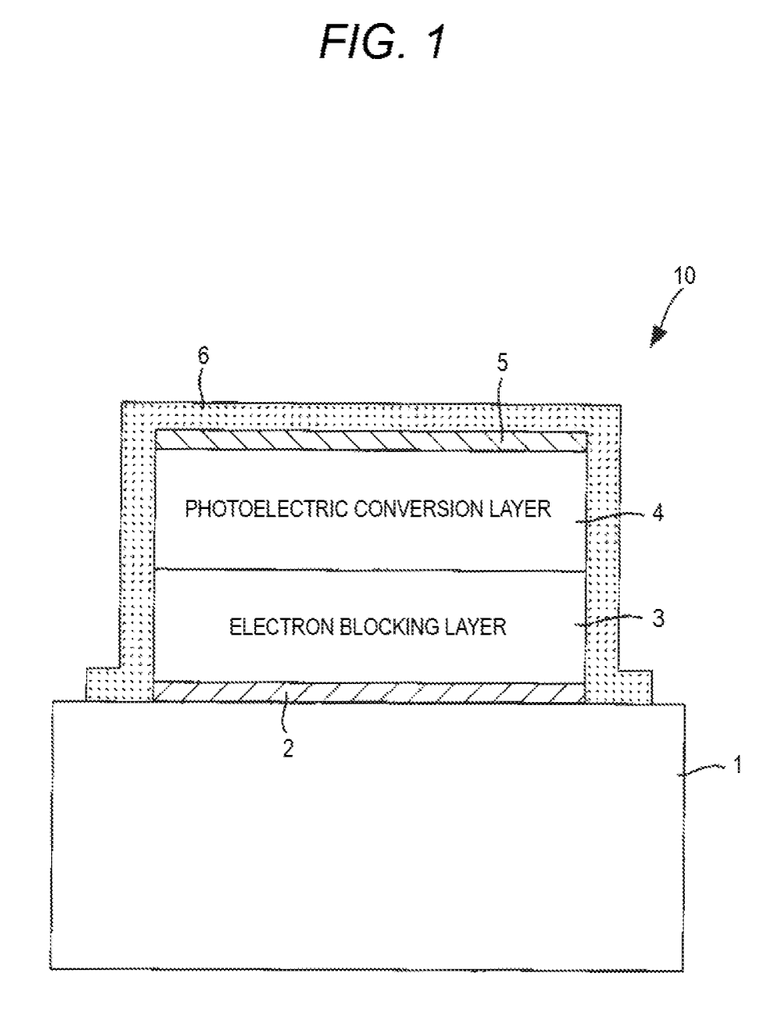
FIG. 1 is a cross-sectional view schematically illustrating the configuration of a photoelectric, conversion device for describing an embodiment of the present invention.

FIG. 1 is a cross-sectional view schematically illustrating the constitution of the photoelectric conversion device for describing an embodiment of the present invention. A photoelectric conversion device 10 shown in FIG. 1 includes a substrate 1, an electrode 2 formed on the substrate 1, an electron blocking layer 3 formed on the electrode 2, a photoelectric conversion layer 4 formed on the electron blocking layer 3, an electrode 5 formed on the photoelectric conversion layer 4, and a sealing layer 6 formed on the electrode 5. A light receiving layer is formed by the electron blocking layer 3 and the photoelectric conversion layer 4. The light receiving layer may be a layer containing at least the photoelectric conversion layer 4. Moreover, the light receiving layer may be a layer containing a layer other than the electron blocking layer 3 (for example, a hole blocking layer).

The substrate 1 is a silicon substrate, a glass substrate or the like.

The electrode 2 is an electrode for collecting holes of electric charges generated in the photoelectric conversion layer 4. The electrode 2 is constituted by a conductive material such as ITO (indium tin oxide) or the like.

The photoelectric conversion layer 4 receives light to generate electric charges according to a quantity of light thereof, and includes an organic photoelectric conversion material. Specifically, the photoelectric conversion layer 4 is composed of a layer at least containing a mixed layer in which a p-type organic semiconductor (p-type semiconductor compound) and two or more different kinds of unsubstituted fullerenes as an n-type organic semiconductor are mixed. A mixed layer means a layer where a plurality of materials are mixed or dispersed, and is a layer formed by, for example, co-depositing a plurality of materials. Alternatively, a mixed layer may be a layer formed by mixing a plurality of materials in a solvent, and applying the resultant material.

The electron blocking layer 3 included in a light receiving layer is a layer configured to suppress an electron from being injected into the photoelectric conversion layer 4 from an electrode 2, and to inhibit the electrons generated in the photoelectric conversion layer 4 from flowing into the electrode 2. The electron blocking layer 3 includes an organic material, an inorganic material, or both of the materials.

The electrode 5 is an electrode for collecting electrons of electric charges generated in the photoelectric conversion layer 4. The electrode 5 uses a conductive material (for example, ITO) sufficiently transparent to light, having a wavelength at which the photoelectric conversion layer 4 has sensitivity in order to allow light to be incident on the photoelectric conversion layer 4. Holes of electric charges generated in the photoelectric conversion layer 4 may be moved to the electrode 2, and electrons thereof may be moved to the electrode 5 by applying a bias voltage between the electrode 5 and the electrode 2.

The sealing layer 6 is a layer for preventing factors deteriorating organic materials such as water and oxygen from permeating the photoelectric conversion layer 4 including the organic materials. The sealing layer 6 is formed to cover the electrode 2, the electron blocking layer 3, the photoelectric conversion layer 4 and the electrode 5.

In the photoelectric conversion device 10 constituted as described above, the electrode 5 is used as an electrode of a light incidence side, and when light is incident from an upper side of the electrode 5, the light permeates the electrode 5 and is incident on the photoelectric conversion layer 4, thus generating electric charges therein. The holes of the generated electric charges move to the electrode 2. The holes moved to the electrode 2 are converted into a voltage signal according to a quantity thereof to be read, thereby making it possible to convert light into a voltage signal and extract it.

Further, the electron blocking layer 3 may be constituted by a plurality of layers. Thereby, an interface is formed between each of the layers constituting the electron blocking layer 3, causing discontinuity at a mid-level present in each layer. As a result, since it is difficult to move electric charges through the mid-level and the like, electron blocking efficiency may be increased. However, if the layers constituting the electron blocking layer 3 are made of the same material, there may be cases where the mid-levels present in the layers may be completely the same as each other, and therefore, it is preferable that the materials of the layers are different from each other in order to further increase electron blocking efficiency.

Further, a bias voltage may be applied so as to collect electrons in the electrode 2 and holes in the electrode 5. In this case, a hole blocking layer may be provided instead of the electron blocking layer 3. The hole blocking layer may be a layer formed by an organic material to suppress the hole from being injected into the photoelectric conversion layer 4 from the electrode 2, and to inhibit the hole generated in the photoelectric layer 4 from flowing into the electrode 2. A hole blocking effect can be enhanced by having a plurality of hole blocking layers.

Further, the electrons or the holes collected in the electrode 5 may be converted into the voltage signal according to the quantity thereof to be extracted to the outside. In this case, the electron blocking layer or the hole blocking layer may be provided between the electrode 5 and the photoelectric conversion layer 4. In either case, the part interposed between the electrode 2 and the electrode 5 becomes a light receiving layer.

Next, an embodiment of a method of manufacturing the photoelectric conversion device 10 will be described.

First, an ITO film is formed on the substrate 1 by, for example, a sputtering method to form the electrode 2. Next, the film of the electron blocking material is formed on the electrode 2 by, for example, a deposition to form the electron blocking layer 3.

Subsequently, the photoelectric conversion layer 4 is formed on the electron blocking layer 3. The forming of the photoelectric conversion layer can be performed by, for example, a vacuum deposition method. Specifically, the photoelectric conversion layer 4 can be formed by co-depositing the p-type organic, semiconductor and two or more different kinds of unsubstituted fullerenes by vacuum thermal evaporation.

Next, for example. ITO is formed on the photoelectric conversion layer 4 by a sputtering method to form the electrode 5. Subsequently, the film of silicon oxide is formed on the electrode 5 and the substrate 1 by, for example, a deposition to form the sealing layer 6.

According to the present manufacturing method, in each process of forming the electrode 2, the electron blocking layer 3, the photoelectric conversion layer 4, the electrode 5 and a sealing layer 6, it is preferred that each forming process is performed in a vacuum in order to prevent degradation of film properties caused by degradation factors of the film such as water and oxygen introduced into a film during film formation.

The photoelectric conversion device 10 can be used in a photo sensor or an imaging device.

By using the photoelectric conversion device of the present invention in which an absorbance of the red region is controlled, it is possible to obtain an imaging device having an excellent color reproduction.

Next, a constitution example of an imaging device using the photoelectric conversion device 10 will be described.

Figure 2:
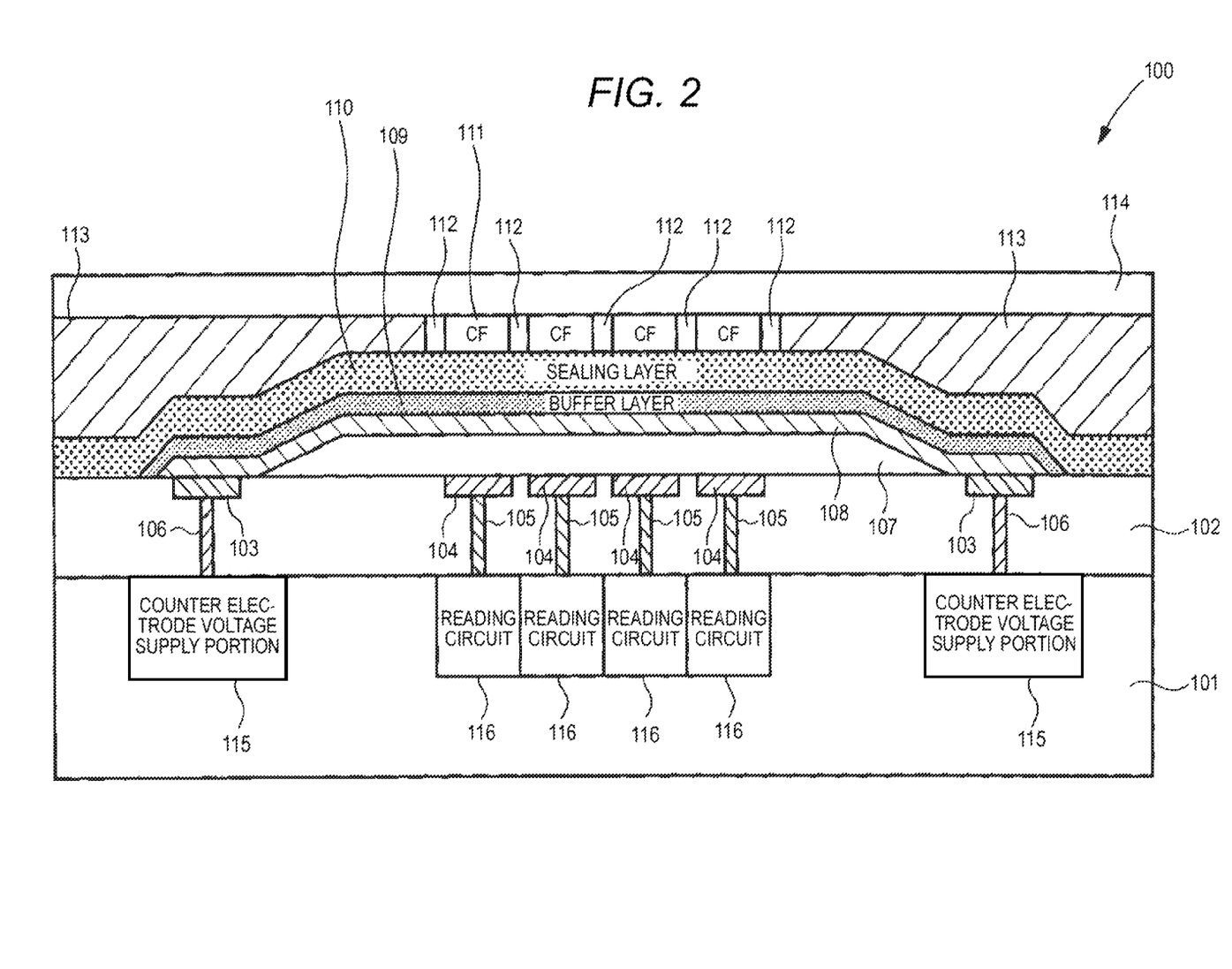
FIG. 2 is a cross-sectional view schematically illustrating the configuration of an imaging device for describing an embodiment of the present invention.

FIG. 2 is a cross-sectional view schematically illustrating the constitution of an imaging device for describing an embodiment of the present invention. The imaging device is mounted and used in an imaging apparatus such as a digital camera, and a digital video camera, and an imaging module such as an electronic endoscope and a mobile phone.

This imaging device has a plurality of photoelectric conversion devices having the same constitution as shown in FIG. 1, and a circuit board on which a reading circuit is formed which reads signals according to the electric charges generated in the photoelectric conversion layer of each of the photoelectric conversion devices, and the plurality of photoelectric conversion devices is one-dimensionally or two-dimensionally arranged on the same surface of an upper side of the circuit board.

An imaging device 100 shown in FIG. 2 includes a substrate 101, a dielectric layer 102, a connection electrode 103, a pixel electrode 104, a connection portion 105, a connection portion 106, a light receiving layer 107, a counter electrode 108, a buffer layer 109, a sealing layer 110, a color filter (CF) 111, a partition wall 112, a light-shielding layer 113, a protection layer 114, a counter electrode voltage supply portion 115, and a reading circuit 116.

The pixel electrode 104 has the same function as the electrode 2 of the photoelectric conversion device 10 shown in FIG. 1. The counter electrode 108 has the same function as the electrode 5 of the photoelectric conversion device 10 shown in FIG. 1. The light receiving layer 107 has the same constitution as the layer formed between the electrode 2 and the electrode 5 of the photoelectric conversion device 10 shown in FIG. 1. The sealing layer 110 has the same function as the sealing layer 6 of the photoelectric conversion device 10 shown in FIG. 1. The pixel electrode 104, a portion of the counter electrode 108 facing the pixel electrode 104, the light receiving layer 107 interposed between the electrodes, the buffer layer 109 facing the pixel electrode 104, and a portion of the sealing layer 110 constitute the photoelectric conversion device.

The substrate 101 is a glass substrate or a semiconductor substrate such as Si. The dielectric layer 102 is formed on the substrate 101. A plurality of pixel electrodes 104 and a plurality of connection electrodes 103 are formed on the surface of the dielectric layer 102.

The light receiving layer 107, which is provided to cover the plurality of pixel electrodes 104, is a layer common to all of the photoelectric conversion devices.

The counter electrode 108 provided on the light receiving layer 107 is a single electrode common to all of the photoelectric conversion devices. The counter electrode 108 is formed up to the connection electrode 103 disposed at the outer side of the light receiving layer 107, and electrically connected to the connection electrode 103.

The connection portion 106 is a plug which is buried in the dielectric layer 102 to electrically connect the connection electrode 103 and the counter electrode voltage supply portion 115, and the like. The counter electrode voltage supply portion 115 is formed on the substrate 101, and applies a predetermined voltage to the counter electrode 108 through the connection portion 106 and connection electrode 103. In the case where the voltage to be applied to the counter electrode 108 is higher than a power voltage of the imaging device, a predetermined voltage is supplied by increasing a power voltage by a voltage increasing circuit such as a charge pump.

The reading circuit 116 is installed on the substrate 101 to correspond to each of a plurality of pixel electrodes 104, and reads the signals according to the electric charges collected in the corresponding pixel electrode 104. The reading circuit 116 is constituted by, for example, a CCD, a CMOS circuit or a TFT circuit, and is light-shielded by a light-shielding layer (not shown) disposed in the dielectric layer 102. The reading circuit 116 is electrically connected to the corresponding pixel electrode 104 through the connection portion 105.

The buffer layer 109 is formed on the counter electrode 108 to cover the counter electrode 108. The sealing, layer 110 is formed on the butler layer 109 to cover the buffer layer 109. The color filter 111 is formed at a position dicing each of the pixel electrodes 104 on the sealing layer 110. The partition wall 112 is installed between the color filters 111 to improve light transmittance efficiency of the color filters 111.

The light-shielding layer 113 is formed in a region other than a region where the color filter 111 and the partition wall 112 are installed on the sealing layer 110, and prevents light from being incident on the light receiving layer 107 formed in a region other than an effective pixel region. The protection layer 114 is formed on the color filter 111, the partition wall 112 and the light-shielding layer 113, and protects the entire imaging device 100.

In the imaging device 100 thus constituted, when light is incident, light is incident on the light receiving layer 107, and electric charges are generated herein. The holes of the generated electric charges are collected in the pixel electrode 104, and the voltage signal according to the quantity thereof is output to the outside of the imaging device 100 by the reading circuit 116.

A method of manufacturing the imaging device 100 is as follows.

The connection portions 105 and 106, a plurality of connection electrodes 103, a plurality of pixel electrodes 104 and the dielectric layer 102 are formed on the circuit board on which the counter electrode voltage supply portion 115 and the reading circuit 116 are formed. The plurality of pixel electrodes 104 are arranged on the surface of the dielectric layer 102, for example, in a square lattice form.

Next, the light receiving layer 107 is formed on a plurality of pixel electrodes 104 by, for example, a vacuum thermal evaporation method. Then, the counter electrode 108 is formed on the light receiving layer 107 by, for example, a sputtering method in a vacuum. Subsequently, the buffer layer 109 and the sealing layer 110 are sequentially formed on the counter electrode 108 by, for example, a vacuum thermal evaporation method. Next, after the color filter 111, the partition wall 112 and the light-shielding layer 113 are formed, the protection layer 114 is formed, thereby completing the imaging device 100.

Hereinafter, constituent elements (the electron blocking layer 3, the hole blocking layer, the photoelectric conversion layer 4, the electrode 2, the electrode 5 and the sealing layer 6) of the photoelectric conversion device will be described in detail.

[Photoelectric Conversion Layer]

The photoelectric conversion layer 4 contains a p-type semiconductor compound and two or more different kinds of unsubstituted fullerenes.

The film thickness of the photoelectric conversion layer is not particularly limited, but is preferably from 10 nm to 1000 nm, and more preferably from 100 nm to 800 nm.

The photoelectric conversion layer 4 can be formed by a dry film forming method or a wet film forming method. The dry film forming method is preferred in that uniform film formation is facilitated, impurities are hard to be introduced, and controlling a film thickness or laminating on a material of a different kind is facilitated.

Specific examples of the dry film forming method include a vacuum deposition method, a sputtering method, an ion plating method, a physical vapor growth method such as a MBE method or a CVD method such as plasma polymerization. The vacuum deposition method is preferred, and when a film is formed by the vacuum deposition method, manufacturing conditions such as the degree of vacuum and a deposition temperature may be determined according to a general method. In the case where the photoelectric conversion layer 4 is formed by a deposition method, a thermal decomposition at a deposition can be suppressed when a decomposition temperature is higher than a temperature wherein the deposition is possible. Accordingly, it is preferable.

When the photoelectric conversion layer 4 is formed by the dry film forming method, the degree of vacuum is preferably $1 \times 10^{-3}$ or less, more preferably $4.0 \times 10^{-4}$ Pa or less, and particularly preferably $1 \times 10^{-4}$ Pa or less, in consideration of preventing a degradation of device properties when forming the photoelectric, conversion layer.

Examples of the substituted fullerenes constituting the photoelectric conversion layer 4 are $C_n$ (wherein, n is an integer of 60 or more, geometrically forming a spherical compound), a mixed fullerene or a fullerene nanotube. $C_n$ is preferred under the control of the absorbance of the red region.

Examples of $C_n$ include fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, and the like fullerene $C_{60}$, fullerene $C_{70}$ and fullerene $C_{76}$ are preferred, and fullerene $C_{60}$ and fullerene $C_{70}$ are more preferred.

Two or more different kinds of unsubstituted fullerenes are used in the photoelectric conversion layer 4, but at least one is preferably $C_n$ under the control of the absorbance of the red region (wherein, n is an integer of 60 or more, geometrically forming a spherical compound). More preferably, at least one is fullerene $C_{60}$, and even more preferably at least one other kind is fullerene $C_{70}$ in addition to fullerene $C_{60}$. Furthermore, under the control of the absorbance of the red region, as the kinds of unsubstituted fullerenes, two kinds of unsubstituted fullerenes are preferred, and the two kinds of unsubstituted fullerenes are preferably fullerene $C_{60}$ and fullerene $C_{70}$.

When fullerene $C_{60}$ and fullerene $C_{70}$ are used in combination, in order to obtain a desirable photoelectric conversion efficiency by controlling an absorbance of the red region, the ratio of the content of $C_{70}$ in the photoelectric conversion layer 4 is preferably from 1% by volume to 99% by volume based on the sum of $C_{60}$ and $C_{70}$, more preferably, from 20% by volume to 99% by volume, and even more preferably, from 40% by volume to 99% by volume.

As the photoelectric conversion layer 4 contains an unsubstituted fullerene, it is possible to rapidly transport electric charges generated by photoelectric conversion to the electrode 2 or the electrode 5 via fullerene molecules. When the fullerene molecule is in a continuous state such that an electron path is formed, electron transport property is improved, thereby making it possible to realize high-speed response of the photoelectric conversion device. For this purpose, it is preferred that the ratio of the content of fullerene [fullerene (the content of the total of two or more kinds of fullerenes)/the p-type semiconductor compound×100(%)] in the photoelectric conversion layer 4 is 50% by volume or more. Further, it is preferred that the ratio of the content of the fullerene in the photoelectric conversion layer 4 is 85% by volume or less, from the viewpoint of maintenance of a junction interface of the p-type organic semiconductor and exciton dissociation efficiency and.

In the photoelectric conversion layer 4, it is particularly preferred to use a triarylamine compound as a p-type organic semiconductor to be mixed with an unsubstituted fullerene as disclosed in Japanese Patent No. 4213832 and the like because it is possible to achieve a high SN ratio of a photoelectric conversion device. If a ratio of fullerene in the photoelectric conversion layer is too high, the triarylamine compound becomes less, such that the absorption quantity of incident light is reduced. As a result, photoelectric conversion efficiency is reduced, and therefore, it is preferred that the ratio of the content of fullerene contained in the photoelectric conversion layer 4 is 85% by volume or less.

The p-type organic semiconductor (p-type semiconductor compound) is a donor-type organic semiconductor (compound), mainly represented by a hole transporting organic compound, and an organic compound having a property of easily donating electrons. More specifically, the p-type organic semiconductor material is an organic compound having a lower ionization potential when two organic materials are used in contact with each other. Accordingly, the donor-type organic compound may be any organic compound as long as the organic compound is an electron-donating organic compound. For example, a metal complex having a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, merocyanine compound, an oxonol compound, a polyamine compound, an indole compound, a pyrrole compound, a pyrazole compound, a polyarylene compound, a condensed aromatic carbon ring compound (a naphthalene derivative, an anthracene derivative, a phenanthrene derivative, a tetracene derivative, a pyrene derivative, a perylene derivative, and a fluoranthene derivative), or a heterocyclic compound containing nitrogen as a ligand and like may be used. Further, the examples are not limited thereto, and any organic compound may be used as a donor-type organic semiconductor as long as the organic compound is an organic compound having the ionization potential that is lower than that of the organic compound used as the n-type organic semiconductor.

Any organic dye may be used as the p-type organic semiconductor, but preferably, may include a cyanine dye, a styryl dye, a hemicyanine dye, a merocyanine dye (including zeromethine merocyanine (simple merocyanine)), a trinuclear merocyanine dye, a tetranuclear merocyanine dye, a laudacyanine dye, a complex cyanine dye, a complex merocyanine dye, an allophore dye, an axonal dye, a hemioxonol dye, a squarylium dye, a croconium dye, an azamethine dye, a coumarin dye, an arylidene dye, an anthraquinone dye, a triphenylmethane dye, an azo dye, an azomethine dye, a spiro compound, a metal locene dye, a fluorenone dye, a fulgide dye, a perylene dye, a perinone dye, a phenazine dye, a phenothiazine dye, a quinone dye, a diphenylmethane dye, a polyene dye, an acridine dye, an acrydinone dye, a diphenylamine dye, a quinacrydone dye, a quinaphthalone dye, a phenoxazine dye, a phthaloperylene dye, a diketopyrrolopyrrole dye, a dioxane dye, a porphyrine dye, a chlorophyll dye, a phthalocyanine dye, a metal complex dye, and a condensed aromatic carbon ring-based dye (a naphthalene derivative, an anthracene derivative, a phenanthrene derivative, a tetracene derivative, a pyrene derivative, a perylene derivative, and a fluoranthene derivative).

It is preferred that the p-type organic semiconductor has a peak wavelength of the absorption spectrum of 600 nm or less in chloroform solution (concentration of $1 \times 10^{-5}$ mol/L), and the maximum molar extinction coefficient is 30,000 $M^{-1}$ $cm^{-1}$ or more in the visible region having a wavelength of 400 nm to 700 nm. This is because it is better that the molar extinction coefficient is as high as possible in consideration of an effective use of the light.

The peak wavelength is preferably from 450 nm to 600 nm, and more preferably from 480 nm to 600 nm. The maximum molar extinction coefficient in the visible region is preferably 35,000 $M^{-1}$ $cm^{-1}$ or more, and more preferably 40,000 $M^{-1}$ $cm^{-1}$ or more.

The p-type organic semiconductor is preferably a compound represented by the following Formula (1).

[Chem. 1]

(1)

(wherein, in the formula, each of $L_2$ and $L_3$ represents a methine group. n represents an integer of 0 to 2. $Ar_1$ represents a divalent substituted arylene group or an unsubstituted arylene group. Each of $Ar_2$ and $Ar_3$ independently represents a substituted aryl group, an unsubstituted aryl group, a substituted alkyl group, an unsubstituted alkyl group, a substituted heteroaryl group, or an unsubstituted heteroaryl group. $L^1$ is a methine group which is bonded to the following Formula (2), or a group represented by Formula (3).

[Chem. 2]

(2)

(3)

(wherein each of $R_1$ and $R_2$ to $R_7$ independently represents a hydrogen atom, or a substituent, and any of adjacent $R_1$ and $R_2$ to $R_7$ may be bonded to each other to form a ring. m represents an integer of 1 to 3. When m is 2 or more, a plurality of $R_1$ may be the same as or different from every other $R_1$. In Formula (2), * represents a bonding site to $L_1$, and in Formula (3), * represents a bonding site to $L_2$ or $Ar_1$.

The arylene group represented by $Ar_1$ is preferably an arylene group having 6 to 30 carbon atoms, and more preferably an arylene group having 6 to 18 carbon atoms. The arylene group may have a substituent, and is preferably an arylene group having 6 to 18 carbon atoms, which may have an alkyl group having 1 to 4 carbon atoms. Examples thereof include a phenylene group, a naphthylene group, a methylphenylene group, dimethylphenylene group and the like, and a phenylene group or a naphthylene group is preferred.

Each of the an groups represented by $Ar_2$ and $Ar_3$ is independently preferably an aryl group having 6 to 30 carbon atoms, and more preferably an aryl group having 6 to 18 carbon atoms. The aryl group may have a substituent, and is preferably an aryl group having 6 to 18 carbon atoms, which may have an alkyl group having 1 to 4 carbon atoms or an aryl group having 6 to 18 carbon atoms. Examples thereof include a phenyl group, a naphthyl group, a tolyl group, an anthryl group, a dimethylphenyl group, a biphenyl group and the like, and a phenyl group or a naphthyl group is preferred.

The alkyl group represented by $Ar_2$ and $Ar_3$ is preferably an alkyl group having 1 to 6 carbon atoms, and more preferably an alkyl group having 1 to 4 carbon atoms. Examples thereof include a methyl group, an ethyl group, n-propyl group, an isopropyl group, an n-butyl group, an isobutyl group and a t-butyl group, and a methyl group or an ethyl group is preferred, and a methyl group more preferred.

Each of the heteroaryl group represented by $Ar_2$ and $Ar_3$ is independently preferably a heteroaryl group having 3 to 30 carbon atoms, and more preferably a heteroaryl group having 3 to 18 carbon atoms. The heteroaryl group may have a substituent, and preferably a heteroaryl group having 3 to 18 carbon atoms, which may have an alkyl group having 1 to 4 carbon atoms or an aryl group having 6 to 18 carbon atoms. In addition, the heteroaryl group represented by $Ar_2$ and $Ar_3$ may be a condensed ring structure, and preferably a condensed ring structure of a combination of rings selected from a furan ring, a thiophene ring, a selenophene ring, a silole ring, a pyridine ring, pyrazine ring, a pyrimidine ring, an oxazole ring, a thiazole ring, a triazole ring, a oxadiazole ring and a thiadiazole ring (the rings may be the same as each other). A guillotine ring, an isoquinoline ring, a benzothiophene ring, a dibenzothiophene ring, a thienothiophene ring, a bithienobenzene ring and a bithienothiophene ring are preferred.

Any of adjacent $Ar_1$, $Ar_2$, $Ar_3$, $R_1$ and $R_2$ to $R_7$ may be linked to each other to form a ring. This ring is preferably a ring formed of a heteroatom, an alkylene group, an aromatic ring and the like. Examples thereof may include a ring formed together with a nitrogen atom (N in Formula (1)) by linking two of aryl groups (for example, $Ar_1$, $Ar_2$ and $Ar_3$ in Formula (1)) via a single bond or a linking group. Examples of this linking group may include a hetero atom (for example, —O—, —S— and the like), an alkylene group (for example, a methylene group, an ethylene group and the like), and the combination thereof, and preferably —S and a methylene group.

This ring may further have a substituent, and examples of the substituent may include an alkyl group (preferably an alkyl group having 1 to 4 carbon atoms, and more preferably a methyl group), and a plurality of substituents may be linked to each other to further form a ring (for example, a benzene ring and the like).

Further, preferably, $R_3$ and $R_4$ are linked to each other to form a ring, and the ring is preferably a benzene ring.

Further, for $R_1$, if present in plurality (m is 2 or more), any adjacent ones among this plurality of $R_1$'s may be linked to each other to form a ring, and this ring is preferably a benzene ring.

Examples of the substituent when $Ar_1$, $Ar_2$ and $Ar_3$ have a substituent, and the substituent represented by $R_1$ and $R_2$ to $R_7$ may include a halogen atom, an alkyl group (including a cycloalkyl group, a bicycloalkyl group and a tricycloalkyl group), a substituted alkyl group, an alkenyl group (including a cycloalkenyl group and a bicycloalkenyl group), an alkynyl group, an aryl group, a substituted aryl group, a heterocyclic group (also referred to as a hetero ring group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anilino group), ammonio group, an acylamino group, an aminocarbonylamino group, an alkoxycarbonylamino group, an aryloxycarbonylamino group, a sulfamoylamino group, an alkyl and arylsulfonylamino group, mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an imido group, a phosphino group, a phosphinyl group, a phosphinyloxy group, a phosphinylamino group, a phosphono group, a silyl group, a hydrazino group, an ureido group, a boronic acid group (—B(OH)$_2$), a phosphate group (—OPO(OH)$_2$), a sulfato group (–OSO$_3$H) and other known substituents. Especially, $R_1$ and $R_2$ to $R_7$ are preferably an alkyl group, a substituted alkyl group, an aryl group, a substituted aryl group, a heteroaryl group, a cyano group, a nitro group or a halogen atom. As $R_1$, an alkyl group or an aryl group is more preferred. As $R_6$ and $R_7$, a cyano group is more preferred.

Examples of the substituent which the substituted alkyl group or the substituted and group may have include the substituents as listed above, and an alkyl group (preferably an alkyl group having 1 to 4 carbon atoms, more preferably a methyl group) or an aryl group (an aryl group having 6 to 18 carbon atoms, more preferably a phenyl group) is preferred.

The alkyl group represented by $R_1$ and $R_2$ to $R_7$ is preferably an alkyl group having 1 to 6 carbon atoms, and more preferably an alkyl group having 1 to 4 carbon atoms. Examples thereof include a methyl group, an ethyl group, a n-propyl group, an isopropyl group, a n-butyl group, an isobutyl group and a t-butyl group. As $R_2$ to $R_7$, a methyl group or an ethyl group is preferred, and a methyl group is more preferred. As $R_1$, a methyl group, an ethyl group or a t-butyl group is preferred, and a methyl group or a t-butyl group is more preferred.

n is preferably 0 or 1.

Each of the aryl group represented by $R_1$ and $R_2$ to $R_7$ is independently preferably an aryl group having 6 to 30 carbon atoms, and more preferably an aryl group having 6 to 18 carbon atoms. This aryl group may have a substituent, and is preferably an aryl group having 6 to 18 carbon atoms, which may have an alkyl group having 1 to 4 carbon atoms or an aryl group having 6 to 18 carbon atoms. Examples thereof include a phenyl group, a naphthyl group, an anthracenyl group, a pyrenyl group, a phenanthrenyl group, a methylphenyl group, a dimethylphenyl group, a biphenyl group and the like, and a phenyl group, a naphthyl group or an anthracenyl group is preferred.

Each of the heteroaryl group represented by $R_1$, $R_2$ to $R_7$ is independently preferably a heteroaryl group having 3 to 30 carbon atoms, and more preferably a heteroaryl group having 3 to 18 carbon atoms. This heteroaryl group may have a substituent, and is preferably a heteroaryl group having 3 to 18 carbon atoms, which may have an alkyl group having 1 to 4 carbon atoms or an aryl group having 6 to 18 carbon atoms. Further, the heteroaryl group represented by $R_1$ and $R_2$ to $R_7$ is preferably a heteroaryl group containing a five-, six or seven-membered ring or a condensed ring thereof. As the hetero atom contained in the heteroaryl group, an oxygen atom, a sulfur atom and a nitrogen atom can be exemplified. Specific examples of the ring constituting the heteroaryl group may include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiine ring, a pyridine ring, a piperidine ring, an oxazine ring, a morpholine ring, a thiazine ring, a pyridazine ring, a pyrimidine ring, a pyrazine ring, a piperazine ring, a triazine ring, and the like.

Examples of the condensed ring include a benzofuran ring, an isobenzofuran ring, a benzothiophene ring, an indole ring, an indoline ring, an isoindole ring, a benzoxazole ring, a benzothiazole ring, an indazole ring, a benzimidazole ring, a quinoline ring, an isoquinoline ring, a cinnoline ring, a phthalazine ring, a quinazoline ring, a quinoxaline ring, a dibenzofuran ring, a carbazole ring, a xanthene ring, an acridine ring, a phenanthridine ring, a phenanthroline ring, a phenazine ring, a phenoxazine ring, a thianthrene ring, a thienothiophene ring, an indolizine ring, a quinolizine ring, a quinuclidine ring, a naphthyridine ring, a purine ring, a pteridine ring and the like.

m represents an integer of 1 to 3, preferably 1 or 2, and more preferably 1.

Among the compounds represented by Formula (1), the following compound is particularly preferred.

[Chem. 3]

Compound 1

Compound 2

Compound 3

Compound 4

Compound 5

Compound 6

[Chem. 4]

Compound 7

Compound 8

[Chem. 5]

Compound 9

Compound 10

Compound 11

Compound 12

Compound 13

Compound 14

Compound 15

Compound 16

Compound 17

Compound 18

[Chem. 6]

Compound 19

Compound 20

Compound 21

Compound 22

Compound 23

Compound 24

[Electron Blocking Layer]

An electron donating organic material may be used in the electron blocking layer 3. Specifically, an aromatic diamine compound such as N,N'-bis(3-methylphenyl)-1,1'-biphenyl)-4,4'-diamine (TPD) or 4,4'-bis[N-(naphthyl)-N-phenyl-amino]biphenyl (α-NPD), oxazole, oxadiazole, triazole, imidazole, imidazolone, a stilbene derivative, a pyrazoline derivative, tetrahydroimidazole, polyaryl alkane, butadiene, 4,4',4"-tris(N-(3-methyl phenyl)N-phenylamino)triphenylamine(m-MTDATA), porphine, a porphyrin compound such as tetraphenylporphine copper, phthalocyanine, copper phthalocyanine, and titanium phthalocyanineoxide, a triazole derivative, an oxadiazole derivative, an imidazole derivative, a polyarylalkane derivative, a pyrazoline derivative, a pyrazolone derivative, a phenylenediamine derivative, an arylamine derivative, a fluorene derivative, an amino substituted calcone derivative, an oxazole derivative, a styrylanthracene derivative, a fluorenone derivative, a hydrazone derivative, and a silazane derivative may be used as a low molecular material, and a polymer such as phenylenevinylene, fluorene, carbazole, indole, pyrene, pyrrole, picholine, thiophene, acetylene, and diacetylene or a derivative thereof may be used as a polymer material. Any compound having a sufficient hole transporting, property may be used even though the compound is not, an electron donating compound.

Particular examples include the following compound as described in Japanese Patent Laid-Open No. 2008-72090, hut the present invention is not limited thereto. In addition, the following Ea represents an electron affinity of the material, and Ip represents an ionization potential of the material. "EB" of EB-1, 2, . . . is an abbreviation of "electron blocking".

[Chem. 7]

EB-1

Ea = 1.9, Ip = 4.9

EB-2

Ea = 1.7, Ip = 4.7

EB-3

Ea = 1.9, Ip = 5.2

-continued

EB-4

Ea = 2.1, Ip = 5.4

EB-5

Ea = 2.1, Ip = 5.8 m-MTDATA

Ea = 1.9, Ip = 5.1

TPD

Ea = 2.3, Ip = 5.5

An inorganic material may be used as the electron blocking layer 3. In general, the dielectric constant of an inorganic material is larger than that of an organic material, and therefore, when the inorganic material is used for the electron blocking layer 3, a large quantity of voltage is applied to the photoelectric conversion layer 4, thereby enabling to increase the photoelectric conversion efficiency. Examples of the material that may form the electron blocking layer 3 include calcium oxide, chromium oxide, chromiumcopper oxide, manganese oxide, cobalt oxide, nickel oxide, copper oxide, galliumcopper oxide, strontiumcopper oxide, niobium oxide, molybdenum oxide, indiumcopper oxide, indiumsilver oxide, iridium oxide and the like.

In the electron blocking layer 3 including a plurality of layers, among the plurality of layers, the layer adjacent to the photoelectric conversion layer 4 is preferably a layer containing the same material as the p-type organic semiconductor contained in the photoelectric conversion layer 4. By using the same p-type organic semiconductor in the electron blocking layer 3, the formation of mid-level in the interface of the layer adjacent to the photoelectric conversion layer 4 may be suppressed, and thus, dark current may be further suppressed.

In the case where the electron blocking layer 3 is a single layer, the layer may be formed of an inorganic material, and in the case where the electron blocking layer is formed of a plurality of layers, one or two or more layers may be formed of an inorganic material.

[Hole Blocking Layer]

An electron accepting organic material may be used in the hole blocking layer. As the electron accepting material, it is possible to use an oxadiazole derivative such as 1,3-bis(4-tert-butylphenyl-1,3,4-oxadiazolyl)phenylene (OXD-7), an anthraquinonedimethane derivative, diphenylquinone derivative, basocuproine, basophenanthroline and a derivative thereof, a triazole compound, a tris(8-hydroxyquinolinate) aluminum complex, a bis(4-methyl-8-quinolinate)aluminum complex, a distyrylarylene derivative, a silole compound and the like. In addition, although not an electron accepting organic material, it is possible to use any material as long as it has sufficient electron transport property. A porphyrin-based compound, a styryl-based compound such as DCM (4-dicyanomethylene-2-methyl-6-(4-(dimethylaminostyryl))-4H-pyran), or a 4H-pyran-based compound may be used.

[Pixel Electrode]

Examples of the material of the electrode 2 (pixel electrode 104) include metal, metal oxides, metal nitrides, metal borides, an organic conductive compound, a mixture thereof and the like. Specific examples thereof include conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag), chromium (Cr), nickel (Ni), aluminum (Al), mixtures or laminates of the metals and the conductive metal oxides, organic conductive compounds such as polyaniline, polythiophene, and polypyrrole, laminates of the organic conductive compounds and ITO and the like. Particularly preferable examples of the material of the transparent conductive film include any one material of ITO, IZO, tin oxides, antimony-doped tin oxides (ATO), fluorine-doped tin oxides (FTO), zinc oxides, antimony-doped zinc oxides (AZO) and gallium-doped zinc oxides (GZO).

If the step corresponding to the film thickness of the electrode 2 is steeply inclined at an end of the electrode 2, or a significant unevenness is formed on the surface of the electrode 2, or fine dust (particles) is attached on the electrode 2, the layer on the electrode 2 may become thinner than desired, or cracks may occur. If the electrode 5 (counter electrode 108) is formed in such a state on the layer, pixel inferiority such as an increase in dark current or a short-circuit is caused by concentration of electric field or by contact of the electrode 2 and the electrode 5 at a defective portion. Further, the above detects may reduce an adhesion between the electrode 2 and the layer thereon or heat resistance of the photoelectric conversion device 10.

It is preferred that surface roughness Ra of the electrode 2 is 0.6 nm or less in order to prevent the defects from occurring to improve reliability of the device. Low surface roughness Ra of the electrode 2 means a small unevenness of the surface and favorable surface flatness. Further, in order to remove particles on the electrode 2, it is particularly preferred that the substrate is washed by a general washing technology used in the manufacturing process of the semiconductor before the electron blocking layer 3 is formed.

[Counter Electrode]

Examples of the material of the electrode 5 (counter electrode 108) may include metal, metal oxides, metal nitrides, metal borides, an organic conductive compound, a mixture thereof and the like. Specific examples thereof include conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag), chromium (Cr), nickel (Ni), aluminum (Al), and mixtures or laminates of the metals and the conductive metal oxides, organic conductive compounds such as polyaniline, polythiophene, and polypyrrole, laminates of the organic conductive compounds and ITO and the like. The material of the transparent conductive film is particularly preferably arty material of ITO, IZO, tin oxides, antimony-doped tin oxides (ATO), fluorine-doped tin oxides (FTO), zinc oxides, antimony-doped zinc oxides (AZO) and gallium-doped zinc oxides (GZO).

[Sealing Layer]

The following conditions are required for the sealing layer 6 (sealing layer 110).

First, the photoelectric conversion layer needs to be protected by preventing permeation of factors deteriorating the organic photoelectric conversion material included in a solution, a plasma and the like in each manufacturing process of the device.

Second, after the device is manufactured, the photoelectric conversion layer 4 needs to be prevented from being deteriorated during storage and use for a long period of time by preventing permeation of factors deteriorating the organic photoelectric conversion material such as water molecules.

Third, when the sealing layer 6 is thrilled, the photoelectric conversion layer formed prior thereto needs to be prevented from being deteriorated.

Fourth, since incident light reaches the photoelectric conversion layer 4 through the sealing layer 6, the sealing layer 6 needs to be transparent to light having a wavelength detected in the photoelectric conversion layer 4.

The sealing layer 6 may be constituted by a film made of a single material, but by having a multilayered structure to provide different functions for each of the layers, it is possible to expect effects such as a stress relaxation of the entire sealing layer 6, suppression of generation of defects such as cracks and pinholes due to dust emissions during the manufacturing process, and easy optimization of material development, and the like. For example, the sealing layer 6 may have a double-layered structure where a "scaling auxiliary layer" is stacked on a layer that is used for the original purpose of preventing permeation of deterioration factors such as water molecules, and the sealing auxiliary layer has a function that is difficult to be accomplished by the layer. A constitution of three or more layers is feasible, but the number of layers is preferably as small as possible, in consideration of manufacturing cost.

[Formation of the Sealing Layer 6 by the Atomic Layer Deposition Method]

The performance of the photoelectric conversion material is significantly deteriorated due to the deterioration factors such as water molecules. Accordingly, it is required to cover and seal the entire photoelectric conversion layer by ceramics such as dense metal oxides, metal nitrides, and metal oxynitrides or diamond type carbon (PLC) which does not allow water molecules to permeate. In the related art, aluminum oxide, silicon oxide, silicon nitride, silicon oxynitride, a stacked constitution thereof, or a stacked constitution of these and an organic polymer are used to form the sealing layer by various vacuum film-forming technologies. However, in the conventional sealing layer, a step by a structure on the surface of the substrate, fine detects on the surface of the substrate, and particles attached to the surface of the substrate makes it difficult to grow a thin film (because the step becomes a shadow), and accordingly, the film thickness is significantly decreased as compared to a flat portion. As a result, the step portion becomes a path through which the deterioration factors permeate. In order to completely cover the step by the sealing layer, it is preferable that the entire sealing layer is made thick by forming the film to have the thickness of 1 μm or more in the flat portion.

In the imaging device 100 having a pixel dimension of less than 2 μm, and particularly about 1 μm, if a distance between the color filter 111 and the photoelectric conversion layer, that is, the thickness of the sealing layer 110, is large, incident light is diffracted or diverged in the sealing layer 110, thus causing color mixing. Accordingly, the imaging device 100 having the pixel dimension of about 1 μm is preferably manufactured by using a sealing layer material/manufacturing method in which device performance is not deteriorated even when the thickness of the entire sealing layer 110 is reduced.

The atomic layer deposition (ALD) method is a kind of CVD method and a technology of forming a thin film by alternately repeating adsorption/reaction of an organometallic compound molecule, a metal halide molecule, and a metal hydride molecule that are a thin film material, to the surface of the substrate, and decomposition of unreacted groups included therein. When the thin film material reaches the surface of the substrate, the film material is in a low molecular state, and thus, if there is a very small space which allows low molecules to enter, it is possible to grow the thin film. Accordingly, the step portion is completely covered (the thickness of the thin film grown in the step portion is the same as the thickness of the thin film grown in the flat portion) that is considered a difficulty in the conventional thin film forming method, and as a result a step coverage property is very excellent. Accordingly, as the step caused by a structure on the surface of the substrate, fine defects on the surface of the substrate, and particles attached to the surface of the substrate may be completely covered, the step portion does not become a path through which the deterioration factors of the photoelectric conversion material permeate. In the case where the sealing layer 6 is formed by the atomic layer deposition method, the thickness of the sealing layer can be reduced in a required manner more effectively than the conventional technology.

In the case where the sealing layer 6 is formed by the atomic layer deposition method, the material corresponding to the ceramics preferable to the sealing layer 6 may be selected appropriately. However, since the photoelectric conversion layer of the present invention uses the photoelectric conversion material, the material of the photoelectric conversion layer is limited to the material which can be grown to form the thin film at a relatively low temperature at which the photoelectric conversion material is not deteriorated. According to the atomic layer deposition method using alkylaluminum or halogenated aluminum as the material, the dense aluminum oxide thin film may be formed at a temperature of less than 200° C. at which the photoelectric conversion material is not deteriorated. Particularly, in the case where trimethylaluminum is used, the aluminum oxide thin film may be formed even at about 100° C., thereby being preferable. Silicon oxide or titanium oxide may also preferably form the dense thin film at a temperature of less than 200° C. by appropriately selecting the material as in aluminum oxide.

[Sealing Auxiliary Layer]

The thin film formed by the atomic layer deposition method may be an unprecedented, to obtain a high-quality thin film at low temperatures from the viewpoint of step coverage and denseness properties. However, physical properties of the material of the thin film may be deteriorated in some cases by chemicals used in a photolithography process. For example, since the aluminum oxide thin film formed by the atomic layer deposition method is amorphous, the surface thereof is eroded by an alkali solution such as a developing solution or a stripping solution. In this case, the thin film having excellent chemical resistance needs to be formed on the aluminum oxide thin film formed by the atomic layer deposition method, that is, a sealing auxiliary layer is required as a functional layer for protecting the sealing layer 6.

Meanwhile, there are many cases where the thin film formed by a CVD method such as the atomic layer deposition method has tensile stress having very high internal stress, thus, there is a case where deterioration such as cracks in the thin film occurs by a process of repeating intermittent heating and cooling or by storage/use in a high temperature/high humidity atmosphere for a long period of time like the process of manufacturing the semiconductor.

In order to overcome the problem of the sealing layer 6 formed by the atomic layer deposition method as described above, for example, it is preferable to form the sealing auxiliary layer including any one of ceramics such as metal oxides, metal nitrides and metal oxynitrides having excellent chemical resistance, which is formed by a physical vapor deposition (PVD) method such as a sputtering method. Herein, the sealing layer, which is formed by the atomic layer deposition method, is a first sealing layer, and the sealing layer, which is formed on the first sealing layer by the PVD method and includes any one of metal oxides, metal nitrides and metal oxynitrides, is a second sealing layer. Thereby, it is easy to improve chemical resistance of the entire sealing layer 6. Further, since there are many cases where the ceramic film formed by the PVD method such as the sputtering method has high compression stress, tensile stress of the first sealing layer formed by the atomic layer deposition method may be offset. Therefore, stress of the entire sealing layer 6 is relaxed, such that reliability of the sealing layer 6 is increased, and it is possible to significantly suppress occurrence of defects such as deterioration of performance or breakage of the photoelectric conversion layer and the like by stress of the sealing layer 6.

Particularly, it is preferred to have a constitution where the second sealing layer which is formed by the sputtering method and includes any one of aluminum oxides, silicon oxides, silicon nitrides and silicon oxynitrides is provided on the first sealing layer.

It is preferred that the first sealing layer has a thickness of 0.05 μm to 0.5 μm. Further, it is preferred that the first sealing layer includes any one of aluminum oxides, silicon oxides and titanium oxides.

EXAMPLE

Hereinafter, the present invention will be described in detail based on the examples, but the present invention is not limited to the examples.

Example 1

As described below, a solid-state imaging device was manufactured, which includes a photoelectric conversion device having a photoelectric conversion layer and an electron blocking layer between a pair of electrodes.

That is, after an amorphous ITO film is limited by a sputtering method on the silicon substrate where a CMOS circuit is formed as a read-out circuit, patterning is performed by a photolithography such that each single pixel is present on each of the photodiodes (PD) of the CMOS, thereby forming a pixel electrode (lower electrode). An electron blocking layer having a thickness of 100 nm is formed thereon by forming the EB-3 by vacuum thermal evaporation. Thereon is formed a photoelectric conversion layer having a thickness of 400 nm by performing a ternary deposition with Compound 6 (p-type semiconductor compound), fullerene $C_{60}$ and fullerene $C_{70}$ respectively by vacuum thermal evaporation. The volume ratio of fullerene $C_{60}$ and fullerene $C_{70}$ in the photoelectric conversion layer is 3:1. The volume ratio of Compound 6 and fullerene (the sum of fullerene $C_{60}$ and fullerene $C_{70}$) in the photoelectric conversion layer is 1:2. A solid-state imaging device is manufactured in such a manner that on the photoelectric conversion layer, an amorphous ITO film having a thickness of 10 nm is formed as an upper electrode by a sputtering method, thereby forming a transparent electrode (upper electrode). On the upper electrode is formed an oxidized silicon film as a sealing layer by thermal deposition, and an oxidized aluminum film is further formed thereon by ALD method.

An absorption spectrum of Compound 6 in chloroform solution (concentration $1\times10^{-5}$ mol/L) was measured using UV-2550 manufactured by Shimadzu Corporation, and a peak wavelength was 539 nm. Further, the maximum molar extinction coefficient was 50,000 $M^{-1}$ $cm^{-1}$ in the visible region having a wavelength of 400 nm and 700 nm.

Example 2

A solid-state imaging device was manufactured in the same manner as in Example 1, except that the volume ratio of fullerene $C_{60}$ and fullerene $C_{70}$ in the photoelectric conversion layer was changed to 1:1.

Example 3

A solid-state imaging device was manufactured in the same manner as in Example 1, except that the volume ratio of fullerene $C_{60}$ and fullerene $C_{70}$ in the photoelectric conversion layer was changed to 1:3.

Example 4

A solid-state imaging device was manufactured in the same manner as in Example 1, except that the volume ratio of fullerene $C_{60}$ and fullerene $C_{70}$ in the photoelectric conversion layer was changed to 49:2.

Example 5

A solid-state imaging device was manufactured in the same manner as in Example 1, except that the volume ratio of fullerene $C_{60}$ and fullerene $C_{70}$ in the photoelectric conversion layer was changed to 1:99.

Example 6

A solid-state imaging device was manufactured in the same manner as in Example 1, except that Compound 6 in the photoelectric conversion layer was changed to Compound 7.

Example 7

A solid-state imaging device was manufactured in the same manner as in Example 3, except that Compound 6 in the photoelectric conversion layer was changed to Compound 7.

An absorption spectrum of Compound 7 in chloroform solution (concentration $1\times10^{-5}$ mol/L) was measured using UV-2550 manufactured by Shimadzu Corporation, and a peak wavelength was 563 nm. Further, the maximum molar extinction coefficient was 56,000 $M^{-1}$ $cm^{-1}$ in the visible region having a wavelength 400 nm and 700 nm.

Example 8

A solid-state imaging device was manufactured in the same manner as in Example 1, except that the fullerene of the photoelectric conversion layer was changed to perform a quaternary deposition so that the volume ratio of fullerene $C_{60}$, fullerene $C_{70}$ and fullerene $C_{76}$ in the photoelectric conversion layer was 98:4:1.

Comparative Example 1

A solid-state imaging device was manufactured in the same manner as in Example 1, except that the volume ratio of fullerene $C_{60}$ and fullerene $C_{70}$ in the photoelectric conversion layer was changed to 1:0 (i.e., co-depositing only Compound 6 and fullerene $C_{60}$).

Comparative Example 2

A solid-imaging device was manufactured in the same manner as in Example 1, except that the volume ratio of fullerene $C_{60}$ and fullerene $C_{70}$ in the photoelectric conversion layer was changed to 0:1 (i.e., co-depositing only Compound 6 and fullerene $C_{70}$).

Absorbance of each of the photoelectric conversion layers in Examples and Comparative Examples was measured using 11-3310 manufactured by Hitachi High-Technologies Corporation. The ratio of absorbance A(λ nm) in the red region (a long wavelength end region of absorption) is shown in the following Table 1. In addition, external quantum efficiency of each device at a wavelength of 630 nm (a relative value when the value of Comparative Example 1 is 100) is shown in the following Table 1. When measuring the external quantum efficiency, an electric field of $2\times10^{-5}$ V/cm was applied to each device. Absorbance of each device at a wavelength of 680 nm (a relative value when the value of Comparative Example 1 is 100) is shown in the following Table 1.

TABLE 1

| | Compound used in photoelectric conversion layer | Fullerene used in photoelectric conversion layer (Volume ratio) | Ratio of absorbance A(650)/A(680) | Ratio of absorbance A(630)/A(680) | External quantum efficiency at 630 nm (Relative value) | Absorbance at 680 nm |
|---|---|---|---|---|---|---|
| Example 1 | Compound 6 | $C_{60}:C_{70} = 3:1$ | 1.71 | 2.72 | 109 | 120 |
| Example 2 | Compound 6 | $C_{60}:C_{70} = 1:1$ | 1.78 | 2.74 | 120 | 135 |
| Example 3 | Compound 6 | $C_{60}:C_{70} = 1:3$ | 1.81 | 2.78 | 130 | 165 |
| Example 4 | Compound 6 | $C_{60}:C_{70} = 49:2$ | 1.64 | 2.59 | 101 | 105 |
| Example 5 | Compound 6 | $C_{60}:C_{70} = 1:99$ | 1.84 | 2.81 | 140 | 193 |
| Example 6 | Compound 7 | $C_{60}:C_{70} = 3:1$ | 1.72 | 2.73 | 130 | 123 |
| Example 7 | Compound 7 | $C_{60}:C_{70} = 1:3$ | 1.83 | 2.8 | 144 | 170 |
| Example 8 | Compound 6 | $C_{60}:C_{70}:C_{76} = 98:4:1$ | 1.64 | 2.59 | 102 | 109 |
| Comparative Example 1 | Compound 6 | $C_{60}:C_{70} = 1:0$ | 1.62 | 2.58 | 100 | 100 |
| Comparative Example 2 | Compound 6 | $C_{60}:C_{70} = 0:1$ | 1.84 | 2.80 | 140 | 198 |

From the results shown in Table 1, it can be understood that by using two or more different kinds of unsubstituted fullerenes in the photoelectric conversion layer, it is possible to minutely adjust an absorbance in the long wavelength region (the red region), thereby controlling the long wavelength end of absorption. Further, photoelectric conversion efficiency (external quantum efficiency) in the long wavelength region of an imaging device can be improved compared with the case of co-depositing only fullerene $C_{60}$. In addition, an absorbance at a wavelength of 680 nm can be reduced compared with the case of co-depositing only fullerene $C_{70}$. As a result, it is possible to obtain an imaging device having an excellent color reproduction.

Comparative Example 3

Further, in Example 1, it was attempted to manufacture fullerene $C_{60}$ and PCBM as a substituted fullerene in the photoelectric conversion layer to have a volume ratio of 1:1, but the deposition rate of PCBM was reduced during the deposition process, thereby failing to achieve the desired film thickness, and thus the device was unable to be manufactured. Therefore, when conducting a film formation of a substituted fullerene, it is difficult to maintain a constant rate of film formation due to the effect of decomposition and the like, and when forming a photoelectric conversion film containing an unsubstituted fullerene and a substituted fullerene, it is difficult to minutely control the content ratio of the fullerene, and thus it is impossible to control an absorbance of the red region.

PCBM: (compound as below)

[Chem. 8]

INDUSTRIAL APPLICABILITY

According to the present invention, an absorbance of the red region is changed to obtain a photoelectric conversion device having a controlled long wavelength end of absorption. By using the photoelectric conversion device, it is possible to obtain an imaging device having an improved color reproduction.

The present invention has been described in detail with reference to specific embodiments, but it is apparent to those skilled in the art that various changes and modifications may be made without departing from the spirit and scope of the present invention.

The present application is based on Japanese Patent Application (Patent Application No. 2010-084406) filed on Mar. 31, 2010, and Japanese Patent Application (Patent Application No. 2010-291376) filed on Dec. 27, 2010, and the contents of which are incorporated herein by reference.

| Explanation of Reference Numerals | |
|---|---|
| 1: | Substrate |
| 2, 5: | Electrode |
| 3: | Electron blocking layer |
| 4: | Photoelectric conversion layer |
| 6: | Sealing layer |
| 10: | Photoelectric conversion device |

The invention claimed is:

1. A photoelectric conversion device comprising:
a pair of electrodes; and
a photoelectric conversion layer disposed between the pair of electrodes,
wherein:
the photoelectric conversion layer contains a p-type semiconductor compound and two or more different kinds of unsubstituted fullerenes, and
the p-type semiconductor compound has a peak wavelength of an absorption spectrum at 600 nm or less in chloroform solution, and the maximum molar extinction coefficient of 30,000 $M^{-1}$ $cm^{-1}$ or more in the visible region having a wavelength of 400 nm to 700 nm.

2. The photoelectric conversion device according to claim 1,
wherein at least one of the two or more kinds of unsubstituted fullerenes is $C_n$ (wherein, n is an integer of 60 or more, geometrically forming a spherical compound).

3. The photoelectric conversion device according to claim 2,
wherein one of the two or more kinds of unsubstituted fullerenes is $C_{60}$.

4. The photoelectric conversion device according to claim 3,
wherein another of the two or more kinds of unsubstituted fullerenes is $C_{70}$.

5. The photoelectric conversion device according to claim 4,
wherein the ratio of the content of $C_{70}$ in the photoelectric conversion layer is from 20% by volume to 99% by volume based on the sum of $C_{60}$ and $C_{70}$.

6. The photoelectric conversion device according to claim 1,
wherein there are two kinds of unsubstituted fullerenes.

7. The photoelectric conversion device according to claim 6,
wherein the two kinds of unsubstituted fullerenes are $C_{60}$ and $C_{70}$.

8. The photoelectric conversion device according to claim 1,
wherein a ratio of contents of the p-type semiconductor compound and the unsubstituted fullerene [(the content of the total of the two or more kinds of unsubstituted fullerene)/(the content of the p-type semiconductor compound)×100(%)], is 50% (by volume) or more.

9. The photoelectric conversion device according to claim claim 1,
wherein the photoelectric conversion layer is formed by a dry film forming method.

10. The photoelectric conversion device according to claim 9,
wherein the dry film forming method is a vacuum deposition method.

11. A method for manufacturing the photoelectric conversion device of claim 1, comprising:
a step of co-depositing the p-type semiconductor compound and the two or more different kinds of unsubstituted fullerenes by a vacuum thermal evaporation to form the photoelectric conversion layer.

12. A photo sensor comprising the photoelectric conversion device according to claim 1.

13. An imaging device comprising the photoelectric conversion device according to claim 1.

14. A photoelectric conversion device comprising:
a pair of electrodes; and
a photoelectric conversion layer disposed between the pair of electrodes,
wherein:
the photoelectric conversion layer contains a p-type semiconductor compound and two or more different kinds of unsubstituted fullerenes, and
when an absorbance at a wavelength of λ nm is A(λ), A(650)/A(680)>1.62.

15. The photoelectric conversion device according to claim 14,
wherein at least one of the two or more kinds of unsubstituted fullerenes is $C_n$ (wherein, n is an integer of 60 or more, geometrically forming a spherical compound).

16. The photoelectric conversion device according to claim 15,
wherein one of the two or more kinds of unsubstituted fullerenes is $C_{60}$.

17. The photoelectric conversion device according to claim 16,
wherein another of the two or more kinds of unsubstituted fullerenes is $C_{70}$.

18. The photoelectric conversion device according to claim 17,
wherein the ratio of the content of $C_{70}$ in the photoelectric conversion layer is from 20% by volume to 99% by volume based on the sum of $C_{60}$ and $C_{70}$.

19. The photoelectric conversion device according to claim 14,
wherein there are two kinds of unsubstituted fullerenes.

20. The photoelectric conversion device according to claim 19,
wherein the two kinds of unsubstituted fullerenes are $C_{60}$ and $C_{70}$.

21. The photoelectric conversion device according to claim 14,
wherein a ratio of contents of the p-type semiconductor compound and the unsubstituted fullerene [(the content of the total of the two or more kinds of unsubstituted fullerene)/(the content of the p-type semiconductor compound)×100(%)], is 50% (by volume) or more.

22. The photoelectric conversion device according to claim 14,
wherein the photoelectric conversion layer is formed by a dry film forming method.

23. The photoelectric conversion device according to claim 22,
wherein the dry film forming method is a vacuum deposition method.

24. A method for manufacturing the photoelectric conversion device of claim 14, comprising:
a step of co-depositing the p-type semiconductor compound and the two or more different kinds of unsubstituted fullerenes by a vacuum thermal evaporation to form the photoelectric conversion layer.

25. A photo sensor comprising the photoelectric conversion device according to claim 14.

26. An imaging device comprising the photoelectric conversion device according to claim 14.

27. A photoelectric conversion device comprising:
a pair of electrodes; and
a photoelectric conversion layer disposed between the pair of electrodes,
wherein:
the photoelectric conversion layer contains a p-type semiconductor compound and two or more different kinds of unsubstituted fullerenes, and
when an absorbance at a wavelength of λ nm is A(λ), A(630)/A(680)>2.58.

28. The photoelectric conversion device according to claim 27,
wherein at least one of the two or more kinds of unsubstituted fullerenes is $C_n$ (wherein, n is an integer of 60 or more, geometrically forming a spherical compound).

29. The photoelectric conversion device according to claim 28,
wherein one of the two or more kinds of unsubstituted fullerenes is $C_{60}$.

30. The photoelectric conversion device according to claim 29,
wherein another of the two or more kinds of unsubstituted fullerenes is $C_{70}$.

31. The photoelectric conversion device according to claim 30,
wherein the ratio of the content of $C_{70}$ in the photoelectric conversion layer is from 20% by volume to 99% by volume based on the sum of $C_{60}$ and $C_{70}$.

32. The photoelectric conversion device according to claim 27,
wherein there are two kinds of unsubstituted fullerenes.

33. The photoelectric conversion device according to claim 32,
wherein the two kinds of unsubstituted fullerenes are $C_{60}$ and $C_{70}$.

34. The photoelectric conversion device according to claim 27,
wherein a ratio of contents of the p-type semiconductor compound and the unsubstituted fullerene [(the content of the total of the two or more kinds of unsubstituted fullerene)/(the content of the p-type semiconductor compound)×100(%)], is 50% (by volume) or more.

35. The photoelectric conversion device according to claim 27,
wherein the photoelectric conversion layer is formed by a dry film forming method.

36. The photoelectric conversion device according to claim 35,
wherein the dry film forming method is a vacuum deposition method.

37. A method for manufacturing the photoelectric conversion device of claim 27, comprising:
a step of co-depositing the p-type semiconductor compound and the two or more different kinds of unsubstituted fullerenes by a vacuum thermal evaporation to form the photoelectric conversion layer.

38. A photo sensor comprising the photoelectric conversion device according to claim 27.

39. An imaging device comprising the photoelectric conversion device according to claim 27.

* * * * *